United States Patent
Siaud et al.

(10) Patent No.: US 8,351,415 B2
(45) Date of Patent: Jan. 8, 2013

(54) DYNAMIC TIME INTERLEAVING METHOD AND AN ASSOCIATED DEVICE

(75) Inventors: Isabelle Siaud, Rennes (FR); Anne-Marie Ulmer-Moll, Rennes (FR)

(73) Assignee: France Telecom, Paris (FR)

( * ) Notice: Subject to any disclaimer, the term of this patent is extended or adjusted under 35 U.S.C. 154(b) by 530 days.

(21) Appl. No.: 12/521,413

(22) PCT Filed: Dec. 21, 2007

(86) PCT No.: PCT/FR2007/052610
§ 371 (c)(1), (2), (4) Date: Aug. 25, 2009

(87) PCT Pub. No.: WO2008/087351
PCT Pub. Date: Jul. 24, 2008

(65) Prior Publication Data
US 2011/0002323 A1 Jan. 6, 2011

(30) Foreign Application Priority Data
Dec. 29, 2006 (FR) .................... 06 56046

(51) Int. Cl.
*H04J 3/00* (2006.01)
(52) U.S. Cl. ......... 370/345; 370/203; 370/329; 714/748
(58) Field of Classification Search .................. None
See application file for complete search history.

(56) References Cited

U.S. PATENT DOCUMENTS

| | | | |
|---|---|---|---|
| 2002/0114358 A1 | 8/2002 | Roberts et al. | |
| 2003/0223505 A1* | 12/2003 | Verbin et al. | 375/261 |
| 2004/0177306 A1* | 9/2004 | Hiraki | 714/748 |
| 2005/0207510 A1* | 9/2005 | Ojard | 375/299 |
| 2006/0062314 A1* | 3/2006 | Palin et al. | 375/260 |
| 2007/0011559 A1* | 1/2007 | Cioffi et al. | 714/755 |
| 2007/0147529 A1* | 6/2007 | Bocquet | 375/260 |
| 2008/0065969 A1* | 3/2008 | Jain et al. | 714/784 |

FOREIGN PATENT DOCUMENTS

| | | |
|---|---|---|
| EP | 1 235 354 A2 | 8/2002 |
| EP | 1 635 473 A2 | 3/2006 |
| FR | 2 280 483 A1 | 7/2006 |
| WO | WO 01/08426 A2 | 2/2001 |
| WO | WO 2007/066044 A2 | 6/2007 |

OTHER PUBLICATIONS

Darmon et al., "A New Pseudo-Random Interleaving for Antijamming Applications," MILCOM'89, IEEE, pp. 6-10 (Oct. 15, 1989).

\* cited by examiner

*Primary Examiner* — Ayaz Sheikh
*Assistant Examiner* — Nicholas Sloms
(74) *Attorney, Agent, or Firm* — Drinker Biddle & Reath LLP

(57) ABSTRACT

The present invention relates to a time interleaving method (1) and a time interleaver (ETS) for data. The data is intended to be transmitted sequentially by a baseband carrier of a single-carrier transmitter (EM). The method consists in interleaving a block of successive data items according to a particular interleaving law variable in time for a given transmission mode of the transmitter.

10 Claims, 5 Drawing Sheets

DYNAMIC TIME INTERLEAVING METHOD AND AN ASSOCIATED DEVICE

CROSS-REFERENCE TO RELATED APPLICATIONS

This application is the U.S. national phase of the International Patent Application No. PCT/FR2007/052610 filed Dec. 21, 2007, which claims the benefit of French Application No. 06 56046 filed Dec. 29, 2006, the entire content of which is incorporated herein by reference.

FIELD OF THE INVENTION

The present invention relates to the field of telecommunications. Within this field, the invention relates more particularly to digital communications. Digital communications include wireless communications and cable communications, for example. The communication transmission medium is commonly called the transmission or propagation channel, originally with reference to an aerial channel and by extension with reference to any channel.

BACKGROUND OF THE INVENTION

The invention concerns interleaving techniques. These techniques are generally used to reduce the correlation introduced by 'selective' filtering inherent to the transmission channel.

The invention applies to any single-carrier transmission system, i.e. any system in which baseband data symbols are transmitted sequentially in time, as opposed to a multi-carrier signal in which N data symbols previously modulated in baseband by the sub-carriers of an orthogonal frequency-division multiplex (OFDM) are transmitted simultaneously to form a multi-carrier signal. Either way, the data transmitted is then modulated by a frequency in the radio-frequency (RF) band. The baseband information is transmitted in the form of data symbols (QAM, QPSK, BPSK, etc. cells) around the zero frequency.

These symbols are distorted by the transmission channel, the effect of which is to filter the signal transmitted, which is defined by a baseband equivalent filter whose impulse response $h(t, \tau)$ depends on two variables t and $\tau$, where t represents time and $\tau$ represents the time-delays associated with the coefficients of the filter at time t. The transmission channel, also referred to as the multipath channel, produces correlation of the received symbols in the time domain over a period of the order of the coherence time of the transmission medium. The coherence time is the average value of the time shift necessary to ensure decorrelation of the signal representative of the transmission medium and the time-shifted version of the signal.

This correlation limits the performance of decision circuits in the receiver. It induces packet errors after decisions are made in respect of the transmitted data symbols and after the bits are decoded. These effects are encountered when the environment is a multipath environment and varies slowly or, more generally, if the transmission bit rate of the system is high compared to the Doppler frequency of the transmission medium.

This applies to ultrawideband systems in particular, in which the transmission band above 500 megahertz (MHz) is used for transmission in the {3.1-10.6} gigahertz (GHz) band in an environment that varies little with time at very high bit rates, up to 1 giga bits per second (Gbps). One example of a UWB system is described in the document by R. Fischer, R. Kohno, M. MacLaughlin, M. Wellborn, "DS-UWB Physical Layer Submission to 802.15 Task Group 3a", reference: IEEEP802.15-04/137r3, July 2004.

This also applies to millimeter band systems, in particular 60 GHz systems, for which the target bit rates proposed by the IEEE 802.15.3c standardization group are much higher than 1 Gbps. These systems are dedicated to deployment in buildings. They are near-field systems in which RF coverage inside buildings at these bit rates is less than 10 meters (m) to 15 m. More generally, this correlation imposes a penalty on any transmission system in which the transmission bit rate or the modulation rate is high compared to the Doppler frequency of the transmission medium.

Another example concerns systems associated with the IEEE 802.16 standard in bands above 11 GHz and below 66 GHz, in which interleaving methods of single-carrier transmission are static for a given transmission mode. These systems are described in the IEEE document Std 802.16-2004, "IEEE Standard for Local and Metropolitan Area Networks Part 16: Air Interface for Fixed Broadband Wireless Access Systems", June 2004.

One method of removing this correlation interleaves the binary data or the data symbols for transmission using an interleaving depth expressed in time that must be greater than the coherence time of the transmission medium. In practice, the coherence time is deduced from the autocovariance function $\Phi(\Delta t)$ of the signal associated with the transmission medium and corresponds to the time shift $\Delta t$ necessary for obtaining a statistical autocorrelation coefficient less than a value usually between 0.9 and 0.5 inclusive. An estimate of this value is also given by the reciprocal of the Doppler frequency of the transmission medium. An interleaving depth greater than the coherence time is in practice difficult to obtain in systems with very high bit rates because the latency time that interleaving introduces into the system limits the available bit rate in real time. Data is transmitted in packet mode. Packet size is generally inversely proportional to bit rate, and each packet is transmitted independently. As a result the interleaving depth is limited by the packet size and is usually less than the coherence time of the transmission medium.

Interleaving techniques are therefore applied to the data in a transmission system to decorrelate the received data and to improve the performance of the decision circuits.

At bit level, if the system includes an error corrector coding device, the interleaving techniques applied after coding reduce the received error packet size because the de-interleaving at the input of the decoder disseminates the bits with a high probability of decision errors and the decoder can correct those errors. Interleaving is referred to as bit interleaving when it is applied to coded bits or as scrambling when it is applied to bits extracted directly from the source.

Symbol interleaving relates to a block of symbols with complex values of given size formed of complex (QPSK, x-QAM, BPSK, etc.) signals resulting from a symbol binary coding operation usually referred to as digital modulation. Interleaving can apply different laws for the phase and quadrature components (I,Q components) of the baseband modulated signal.

Interleaving is always applied to the payload data of the transmitter with a static interleaving law for each transmission mode defined by the number of modulation states, the coding, etc. The expression "payload data" refers to transmitted data that carries an information message and not including data dedicated to signaling and identification. In the remainder of the present document, the term "data" designates "payload data", whether binary or in data symbol form.

All known single-carrier digital radio communications systems use a specific data permutation law that is unique for a given transmission mode.

The UWB-DS-CDMA (Ultra Wide Band Direct Sequence Coded Division Multiple Access) system promulgated in July 2004 in the context of the IEEE 802.15.3a standard for ultra-wideband near-field systems does not include symbol interleaving as such. The bit interleaving applied to the coded bits from the source is similar to symbol interleaving if a symbol consists of one bit. In one transmission mode, the system uses BPSK (binary phase-shift keying) modulation resulting from a thresholding function that transforms a bit having values in the binary space {0,1} into a binary symbol having values in a sub-space {−1,1}. This concept makes the binary interleaver used similar to a symbol interleaver. The UWB-DS-CDMA interleaver is of the convolutional type, and its structure is unique for each transmission mode and common to all the transmission modes. This interleaver is described in the document by J. L. Ramsey, "Realization of optimum interleavers", IEEE Tr. on Inf. Th., Vol. IT-16, May 1970, pp. 338-345. The transmission system is illustrated by the diagram of FIG. 1. The transmitter EM comprises a source data interleaving module ETBB, a channel coding module CC, a puncturing module PE, a bit interleaving module ETB, a transmit filter FL. The transmitter uses ternary spreading codes with values in the subspace {−1,0,1} of size Lc__24, called −24(−1/0/1) codes.

The interleaving law used by the binary interleaver ETB does not vary with the length of the spreading sequence, the modulation chosen, or the spreading sequence for generating a required bit rate. The interleaving process applied to the bits associated with the BPSK symbols for the obligatory mode of the standard is a convolutional interleaving process that generates a fixed and static spread between the symbols for the transmission mode described. However, this convolutional interleaver is not a block interleaver of size K defining a bijective law in the space of integers over the subset I={0, . . . , K−1}. As its name indicates, the convolutional interleaver defined by the Ramsey algorithm is a device for storing data in a buffer memory and interleaving the data by time-shifting the data on each clock pulse by a delay proportional to an individual delay Jo. The spread corresponding to the distance between the indices of the input data at the output of the interleaving module is a multiple of Jo, the size of the individual shift register of the interleaving system, and is strictly less than the product of the number No of branches and this individual delay Jo. The interleaving process is illustrated by the diagram of FIG. 2, which represents the time shift that is a multiple of Jo between the interleaved coded bits bce and the coded bits be before interleaving. Even if interleaving is convolutional, the interleaving pattern is stationary in the broad sense and the law is constant regardless of the time concerned.

More generally, for known single-carrier systems, the interleaving processes used for a given transmission mode are static and stationary in the broad sense. Static interleaving has advantages for estimating the transmission medium because, provided that the transmission medium varies slowly in time compared to the transmission bit rate, it limits the insertion ratio of the training sequences intended to probe the transmission medium. In contrast, interleaving the data on sending it in order to decorrelate the data on reception is of limited efficacy because of the presence of long-term fading caused by the multipath channel varying slowly in time.

SUMMARY OF THE INVENTION

Thus, the technical problem to be solved by the present invention is that of proposing a method of time interleaving data (data symbols or binary data) that is more effective than known methods for a single-carrier transmitter, in particular if the transmission medium varies slowly in time compared to the reciprocal of the transmission modulation rate or bit rate.

To this end, the present invention consists in a method of time interleaving symbols or data intended to be transmitted sequentially by a baseband carrier of a single-carrier transmitter, consisting in interleaving a block of symbols or data according to a particular interleaving law that is variable in time for a given transmission mode of the single-carrier transmitter.

The invention also consists in a time interleaver for symbols or data intended to be transmitted sequentially by a baseband carrier of a single-carrier transmitter, for interleaving a block of symbols or data according to a particular interleaving law, including an interleaving law calculation device suitable for causing the block interleaving law calculated for a given transmission mode of the single-carrier transmitter to vary over time.

The invention further consists in a transmitter comprising the above interleaver and a receiver including a de-interleaving module for de-interleaving demodulated blocks of symbols according to a law that is the inverse of an interleaving law, the module being adapted to calculate the de-interleaving law at particular times, the interleaving law varying with time for a given transmission mode.

Thus block interleaving data consisting of binary data or data symbols by using an interleaving law that differs over time for a given transmission mode, in accordance with the invention, generates virtual time variability of the transmission channel, the effect of which is to reduce locally the coherence time of the transmission medium on reception. This reduces the time correlation that affects the data of a transmission system and consequently improves decision-making in the receiver; the efficacy of the system is thus improved. In contrast to known methods where the interleaving law is static for a given transmission mode, the interleaving law is dynamic, i.e. variable in time.

This virtual variability introduced into the transmission medium can reduce the duration of fast fading of the transmission medium and can obtain greater benefit from interleaving carried out on sending, upstream of interleaving according to the invention.

In one particular embodiment, the time variation of the block interleaving law is obtained by means of a single basic mathematical algorithm integrated into a turbo structure that, by an iterative process, generates a plurality of interleaving laws and selects the laws to be used according to a selection criterion. In particular, the variation is a function of the iteration chosen. This algorithm is the subject matter of French patent application FR 00414113. After N blocks of K data symbols, the algorithm typically uses an interleaving law differing in the number of iterations or in the parameters of the chosen interleaving process, selected according to an interleaved data spread criterion, to dedicated multiplexing of the data, and to the overall constraints of the transmission system.

A block law I(k) of size K is a bijective function that gives the order in which to read at the output an input sequence formed by K data items indexed by an index k varying from 0 to K−1. Let X(k) be an input sequence of an interleaver with interleaving law I(k). Let Y(k) be the output sequence of the interleaver. Then $$Y(k)=X(I(k))$$

i.e. the $k^{th}$ data item of the output sequence of the interleaver having the position index k−1, corresponds to the data item of the input sequence X(0), ..., X(K−1) having the index I(k−1). Unless otherwise indicated, the positions of the input data to be interleaved and the interleaved data are represented in the remainder of the present document only by their position index k/I(k).

In one particular implementation, the variation of the interleaving law is operative every N blocks of K data items, where K and N are integer values, N (N≧1) being a parameter determined as a function of the properties of the transmission channel and the framing of the data. In particular, N and/or K vary in time according to the framing of the data and to at least one criterion associated with the overall performance of the transmission system, and so can be adapted to variations of the environment.

In one particular embodiment, the time variation of the block interleaving law of size K depends on a time index $\underline{n}$ of data blocks.

An interleaving method of the invention proves particularly beneficial for near-field systems delivering high bit rates and requiring low interleaving depths. This applies to ultra-wideband systems, such as the UWB-DS-CDMA system defined by the 802.15.3a working group. The UWB-DS-CDMA system delivers a maximum usable bit rate of 1320 Mbps in the {3.1-4.85} GHz and {6.2-9.7} GHz bands using direct sequence symbol spreading in the time domain in order to introduce time diversity into the signal transmitted and to transmit simultaneously data symbols assigned to different users.

In one particular embodiment, data symbols can be interleaved in data blocks of size K where K is a multiple of the length $K_0$ of the spreading sequence according to the interleaving law that varies in time. The spreading sequence of size $K_0$ spreads a data symbol over $K_0$ samples referred to as "chips". Depending on the spreading algorithm chosen, the system can use $K_0$ different spreading sequences of size $K_0$ to transmit simultaneously $K_0$ data symbols allocated to more than $K_0$ users.

BRIEF DESCRIPTION OF THE DRAWINGS

Other features and advantages of the invention become apparent in the course of the following description with reference to the appended figures provided by way of non-limiting example.

The same references and symbols are used in the various figures to designate the same things.

DETAILED DESCRIPTION

Figure 1:
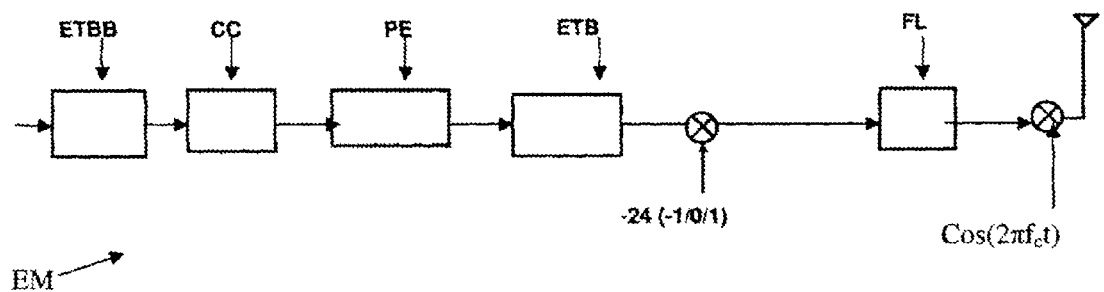
FIG. 1 is a diagram illustrating a prior art static data interleaving method used in a single-carrier system in a particular situation in which a data symbol consists of one bit.
Figure 2:
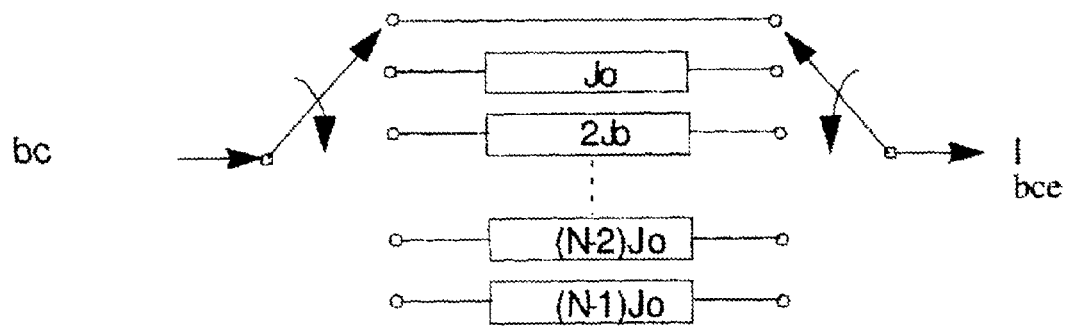
FIG. 2 is a detailed diagram illustrating the interleaving method used by a convolutional interleaver of a prior art transmission system as shown in FIG. 1.
Figure 3:
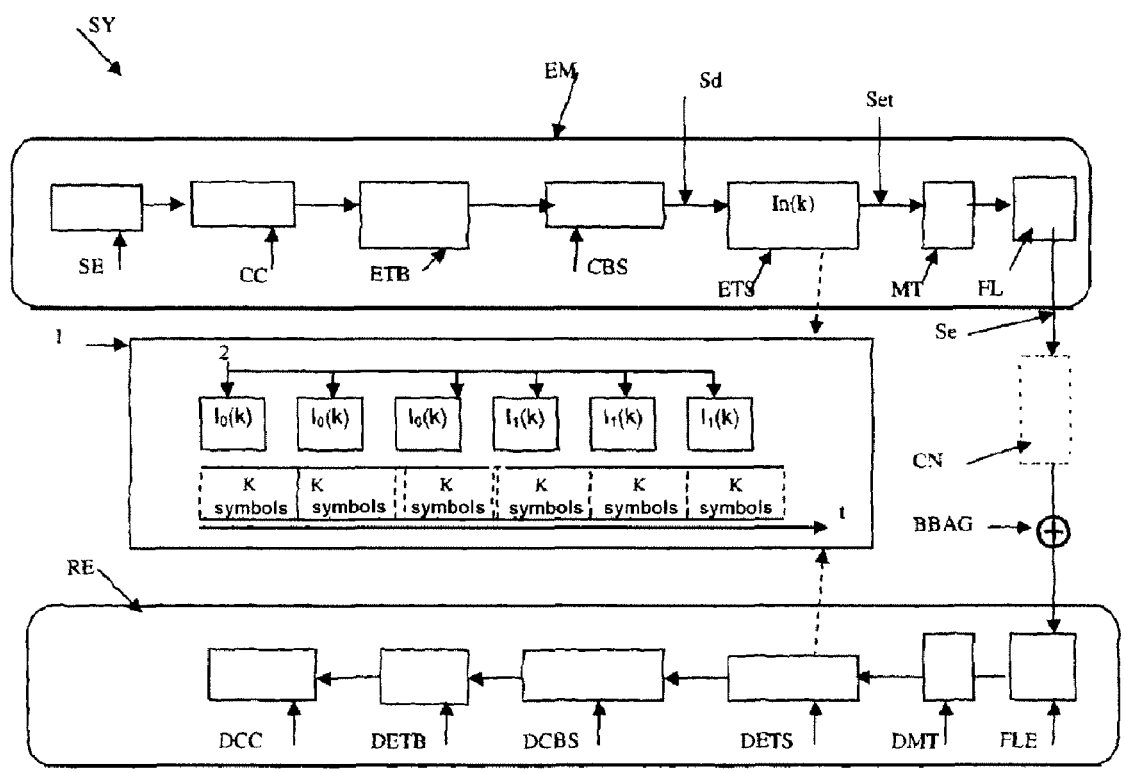
FIG. 3 is a diagram of a transmission system using dynamic symbol block interleaving according to one particular embodiment of the invention.

FIG. 3 is a diagram of one example of a transmission system SY using an interleaving method 1 of the invention. The transmission system SY includes a single-carrier transmitter EM and a receiver RE. The transmitter EM includes a source data generation module SE, a channel coding module CC, a bit interleaving module ETB, a symbol binary coding module CBS, a data symbol time interleaver ETS, a framing device MT, and a transmit filter FL.

The symbol time interleaver ETS includes a device for calculating an interleaving law $I_n(k)$ that is variable in time in accordance with a time index $\underline{n}$ for a given transmission mode of the transmitter EM. The framing device MT distributes the interleaved data symbols Set and the symbols dedicated to estimation of the channel and to synchronization. At the output of the filter FL the transmitted signal Se is transmitted over the propagation channel CN and is affected by Gaussian additive white noise BBAG. This diagrammatic representation is the baseband equivalent of real transmission on a RF carrier.

The receiver RE includes an equalizer filter FLE, a deframing module DMT, a symbol de-interleaving module DETS, a decision module DCBS, a binary de-interleaving module DETB, and a decoding module DCC. The symbol de-interleaving module DETS de-interleaves demodulated symbols in accordance with a law that is the inverse of the interleaving law used on transmission. This de-interleaving module is adapted to calculate at particular times the de-interleaving law that varies with time for a given transmission mode.

An interleaving method 1 of the invention is used by the time interleaver ETS of the transmitter EM. In this example it is applied to the data symbols Sd resulting from symbol binary coding.

The method 1 interleaves successive data symbols Sd in accordance with a particular interleaving law $I_n(k)$. According to the invention, the interleaving law varies in time accordance to the index $\underline{n}$ for a given transmission mode.

The baseband data symbols Sd consist of m coded bits, are converted into complex value signals, and are divided and interleaved by the method 1 to form blocks of K contiguous symbols. In one embodiment, the blocks of K symbols are grouped into groups of N blocks. In this illustration, N=3.

In each block of K symbols, the position of the data symbols is indexed by the integer k varying from 0 to K−1. An interleaving law $I_n(k)$ of size K with time index n varying from 0 to NN'−1, where NN' corresponds to the number of different interleaving laws used, is applied at 2 to each block of K symbols.

In one embodiment, the time variation of the interleaving law is operative every N blocks of K symbols.

Figure 4:
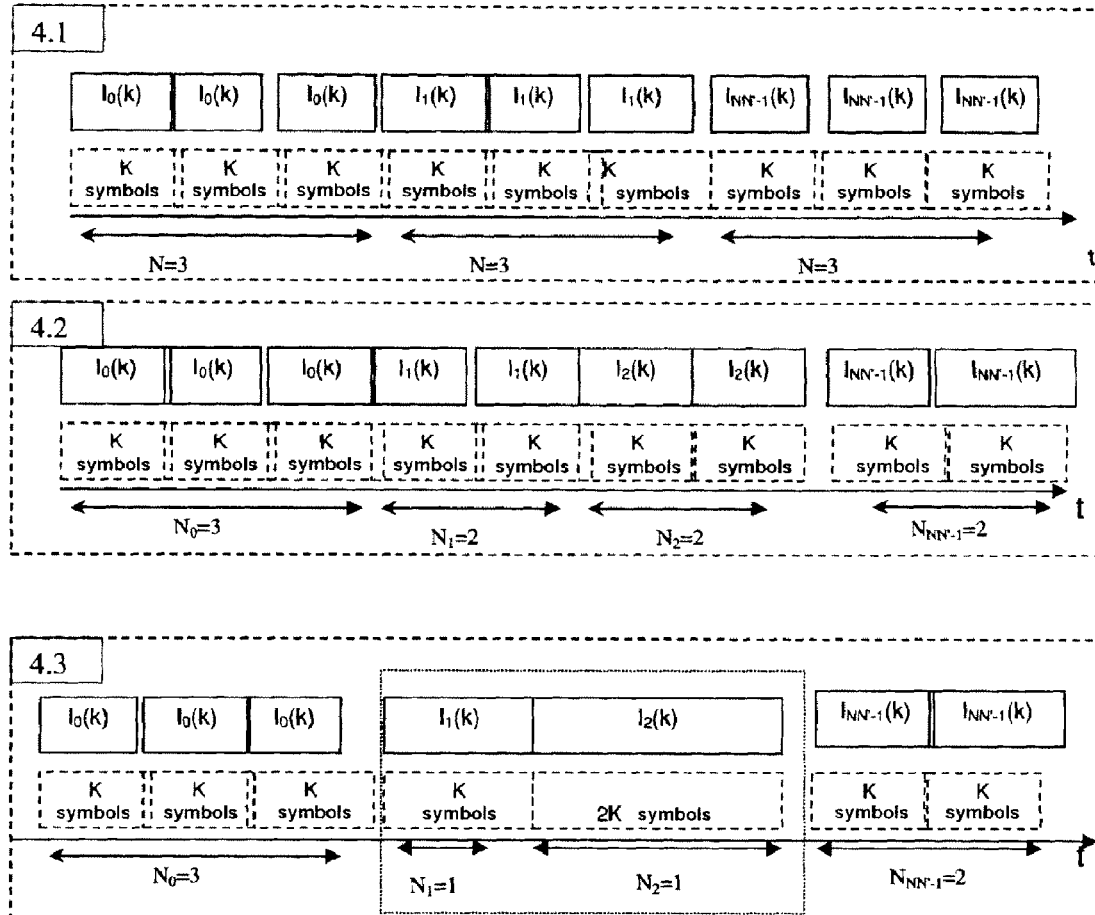
FIG. 4 is a diagrammatic representation of interleaving methods conforming to various embodiments of the invention.

FIG. 4 shows interleaving methods conforming to different embodiments of the invention for which the time variation of the interleaving law is operative every N blocks of K symbols, where N and K can vary in time. The block 4.1 illustrates the situation in which N and K are constant. In this illustration N=3 and the interleaving law changes every three blocks of K symbols. In the situation shown, the interleaving law for the first three blocks is $I_0(k)$, the law for the next N blocks is $I_1(k)$, and so on up to the maximum number NN'−1 of different laws. The block 4.2 illustrates the situation in which N varies, and is denoted $N_n$, and K is constant. The block 4.3 illustrates the situation in which N and K vary and are denoted by the variables $N_n$ and $K_n$ with time index $\underline{n}$.

Thus, depending on the embodiment, the value $N_n$ of the number of blocks of K symbols interleaved by the same interleaving law $I_n(k)$ is variable or constant, or the values $N_n$ of the number of blocks and the block interleaving size $K_n$ are variable, over a pattern consisting of NT blocks of symbols using NN' different interleaving laws, with n varying between 0 and NN'−1.

Figure 5:
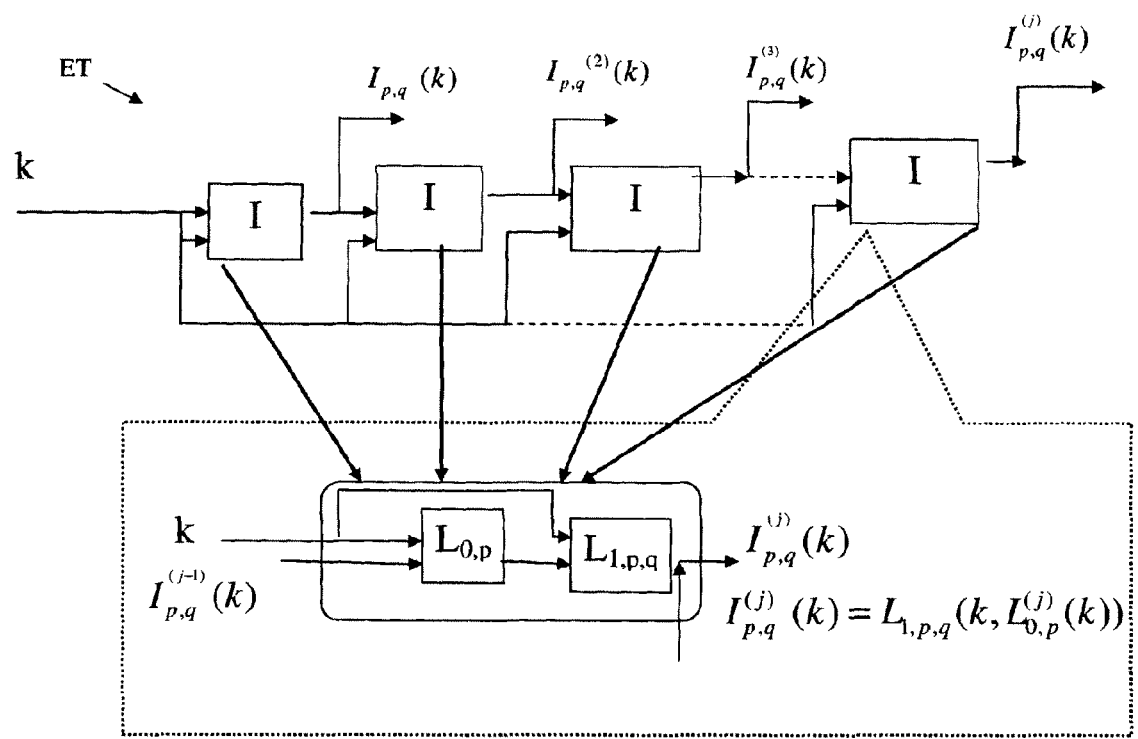
FIG. 5 is a theoretical diagram of an interleaving device using an iterative interleaving algorithm for obtaining an interleaving law varying in time for use by a method of the invention.

FIG. 5 is a theoretical diagram of an interleaving device ET using an iterative interleaving algorithm to obtain an interleaving law that varies in time. The interleaving device ET produces interleaving laws that vary in time for an interleaving method of the invention by modifying the parameters of the algorithm and/or the number of iterations of the algorithm.

The interleaving device ET using the algorithm includes as many basic cells I as there are iterations. The output of the $j^{th}$ basic cell ($I_j$) that corresponds to the $j^{th}$ iteration provides an interleaving pattern that is expressed in the form:

$$I_{p,q}^{(j)}(k)$$

where p and q are two integer parameters describing the basic function I and j is the iteration associated with the basic function I. Using this algorithm effects block interleaving of size K with J iterations of index j, J being greater than or equal to 1, of digital input data indexed by a variable $k=\{0, \ldots, K-1\}$.

Each basic cell I of the interleaving device ET has the same structure: two inputs, one output and two elementary cells $L_{0,p}$ and $L_{1,p,q}$. The integers p and q are two parameters of the interleaving law that are used to generate the required law. Each elementary cell $L_{0,p}$ and $L_{1,p,q}$ has two inputs and one output. One of the two inputs of the two cells $L_{0,p}$ and $L_{1,p,q}$ is identical for these two functions and corresponds to the index variation of the samples before interleaving. The two inputs of the elementary cell $L_{0,p}$ correspond to the two inputs of the basic cell I to which it belongs, and the output of the elementary cell $L_{1,p,q}$ corresponds to the output of the basic cell I to which it belongs. The output of the elementary cell $L_{0,p}$ is connected to a first input of the elementary cell $L_{1,p,q}$. The second input of the elementary cell $L_{1,p,q}$ is connected to a first input of the basic cell I to which it belongs; this input of the basic cell I is fed with the indexes k to be interleaved that generally take the form of a ramp from 0 to K−1. The second input of the basic cell I is connected to the output of the preceding basic cell I, except for the first basic cell, the two inputs of which are connected together and correspond to the index k.

The interleaving algorithm $I_{p,q}^{(j)}(k)$ is therefore based on an iterative structure for which the interleaving law depends on three parameters (K, p, q) and the iteration j concerned. K corresponds to the size of the block to be interleaved, and p and q are two parameters that modify the properties of the interleaving device, in particular the interleaving law and the spread $\Delta_{eff}I_{p,q}^{(j)}(s)$. The spread corresponds to the minimum distance after interleaving of the position indices of input data items separated at the output by s−1 data items. The choice of iteration modifies the interleaving law and the spread whilst retaining a pattern of size p. The variation in time of the interleaving law is obtained by modifying either the iteration or one of the parameters p and q of the interleaving device in accordance with a criterion of optimizing the law or a constraint associated with the transmission system.

This interleaving based on the combination of two algebraic functions $L_{0,p}$ and $L_{1,p,q}$ with a 'turbo' structure has the property of preserving a pattern, i.e. of retaining the multiplexing order of p data streams after interleaving, p being a parameter of the interleaving algorithm that is a sub-multiple of the block interleaving size K and q being an integer parameter used to vary the interleaving law and the spread. In a typical embodiment, q is set arbitrarily at 2 for simplicity and p sets the size of the pattern.

This property of preserving a pattern proves highly beneficial for preserving optimization operations based on multiplexing p data items carried out upstream or downstream of the interleaving operation.

The interleaving law $I_{p,q}^{(j)}(k)$ given by the output of the interleaving module I for the iteration (j) is the result of combining two algebraic functions $L_{0,p}$ and $L_{1,p,q}$ with two inputs and one output described below:

$$L_{0,p}(k,k1)=[-k-k_1 \cdot p]_K \; k=\{0, \ldots, K-1\}$$

$$L_{1,p,q}(k,k_2)=[K-p+k+q \cdot p \cdot k_2]_K, \; k=\{0, \ldots, K-1\}$$

$$I_{p,q}(k,k1)=L_{1,p,q}(k,L_{0,p}(k,k1)) \quad (1)$$

For the iteration j=1, the inputs k and $k_1$ of the function $L_{0,p}$ are identical and correspond to the position indices of the data at the input to the interleaving process. The following expressions result for a pattern of size p and a parameter q:

$$L_{0,p}(k,k)=[-k-p \cdot k]_K=L_{0,p}(k)$$

$$I_{p,q}(k)=L_{1,p,q}(k,L_{0,p}(k))=[K-p+k+q \cdot p \cdot L_{0,p}(k)]_K \; k=\{0, \ldots, K-1\}$$

$$I_{p,q}(k)=[K-p+k+q \cdot p \cdot [-k-p \cdot k]_K]_K \; k=\{0, \ldots, K-1\} \quad (2)$$

The outputs of the algebraic functions $L_{0,p}$ and $L_{1,p,q}$ for the iteration (j) are given by the laws $L_{0,p}^{(j)}(k,k_1)$ and $L_{1,p,q}^{(j)}(k,k_2)$, respectively, for which the variables $k_1$ and $k_2$ are respectively fed by the preceding iteration interleaving law $I_{p,q}^{(j-1)}(k)$ and the output of the function $L_{0,p}$ for the current iteration (j).

For the iteration j, the block of equations (2) is of the form:

$$L_{0,p}^{(j)}(k)=[-k-p \cdot I_{p,q}^{(j-1)}(k)]_K \; k=\{0, \ldots, K-1\}$$

$$I_{p,q}^{(j)}(k)=L_{1,p,q}(k,L_{0,p}^{(j)}(k))=[K-p+k+q \cdot p \cdot L_{0,p}^{(j)}(k)]_K \; k=\{0, \ldots, K-1\}$$

$$I_{p,q}^{(j)}(k)=[K-p+k+q \cdot p \cdot [-k-p \cdot I_{p,q}^{(j-1)}(k)]_K]_K \; k=\{0, \ldots, K-1\} \quad (3)$$

The interleaved output data sequence Y(k) is linked to the input data sequence X(k) before interleaving by the equation:

$$Y(k)=X(I_{p,q}^{(j)}(k))$$

The pseudo-periodic and algebraic structure of the algorithm enables pre-calculation of the spread $$\min_{0 \le k \le K-1} |I_{p,q}^{(j)}(k+s) - I_{p,q}^{(j)}(k)|$$

between data items separated by s−1 data items.

The spread corresponds to the minimum distance after interleaving between the position indices of the input data items when the output data items of the interleaver are separated by s−1 data items.

The spread $\Delta_{eff}I_{p,q}^{(j)}(s)$ for iteration (j) of the interleaving law $I_{p,q}^{(j)}(k)$ is determined from a polynomial $P_{j,p,q,s}(k)$:

$$P_{j,p,q,s}(k)=I_{p,q}^{(j)}(k+s)-I_{p,q}^{(j)}(k)=s-[q \cdot p \cdot (s+p \cdot P_{j-1,p,q,s}(k))]_K$$

$$\Delta_{eff}I_{p,q}^{(j)}(s)=\min_k\{|P_{j,p,q,s}(k)|,K-|P_{j,p,q,s}(k)|\}$$

$$\Delta_{eff}I_{p,q}^{(j)}(s)=\min_k\{|s-[q \cdot p \cdot (s+p \cdot P_{j,p,q,s}(k))]_K|,K-|s-[q \cdot p \cdot (s+p \cdot P_{j,p,q,s}(k))]_K|\} \quad (4)$$

This algebraic function $P_{j,p,q,s}(k)$ depends on the interleaving parameters p and q, where p corresponds to the greatest size of the preserved pattern, q is a parameter that modifies the interleaving law, and (j) is the iteration concerned.

In one particular embodiment of the invention the method includes this kind of iterative interleaving algorithm and a time interleaver ETS of the invention includes this kind of interleaving device ET, with a size K corresponding to the number of symbols per block. The interleaving law varies in time, for example every M symbols, modifying either the number of iterations or one of the parameters p and q of the interleaving device ET for a given transmission mode. The parameters of the iterative interleaving algorithm are then indexed by a time index n that is incremented every N blocks of K symbols and the minimum value of which is zero and the maximum value of which is one less than the number of interleaving laws, i.e. NN'−1, with M=K×N.

The interleaving law given by equations (2) and (3) is modified to take into account the dynamic character of this law as follows: $p_n$, $q_n$, and $j_n$ are the parameters chosen for the law $I_n(k)$ with time index n and NN' corresponds to the number of laws concerned.

$$I_n(k) = I_{p_n,q_n}^{(j_n)}(k)$$

$$I_{p_n,q_n}^{(j_n)}(k) = [K - p_n + k + q_n \cdot p_n \cdot ] - k - p_n \cdot I_{p_n,q_n}^{(j_n-1)}(k)$$

$$k = \{0, \ldots, K-1\} \quad (5)$$

Figure 6:
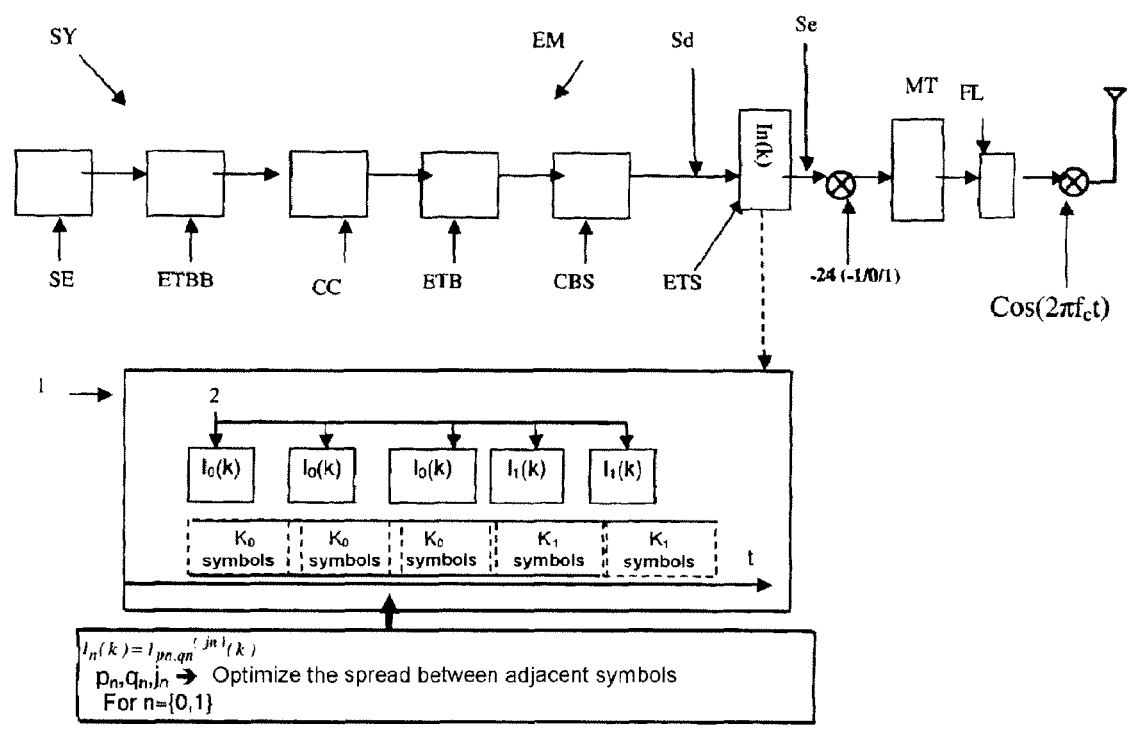
FIG. 6 is a diagram illustrating an example of the use of interleaving conforming to one particular embodiment of the invention in a particular single-carrier transmit/receive system using a direct sequence symbol spreading process.

The following example, which FIG. 6 illustrates, shows that optimization of an interleaving method conforming to one particular embodiment of the invention in the situation of use with a UWB-DS-CDMA system.

The interleaving is applied to blocks of data symbols before spreading the data using spreading sequences defined in Table I in Appendix 1.

A first step of optimizing the method defines the interleaving block sizes $K_n$ possible for the block interleaving laws $I_n(k)$ according to the number of spreading codes used, corresponding to the number of users, and according to the number of data symbols to be transmitted for each user. $K_n$ is for example a multiple of the number Nu of users and of a plurality of data symbols greater than 1 for each user.

A second optimization step determines the NN' interleaving laws $I_n(k)$ to be used and the number $N_n$ of blocks to which the block interleaving law $I_n(k)$ of size $K_n$ is applied according to the iterative algorithm described with reference to FIG. 5. Optimization consists in selecting laws that maximize the spread between adjacent symbols assigned to different users spread by different codes and transmitted on the same RF sub-carrier or adjacent RF sub-carriers. For this configuration, the parameter s to be considered is between 1 and Nu. The values of $p_n$, $q_n$, and $j_n$ are selected to generate a maximal spread $\Delta_{eff} I_{p_n,q_n}^{(j_n)}(s)$ for the chosen values of s. The interleaving algorithm generates an interleaving law of index n less than or equal to NN'−1, firstly according to a parameter $\bar{p}_n$ that is a sub-multiple of $k_n$ that preserves a pattern and modifies the spread and secondly according to a parameter $q_n$ and an iteration $j_n$ that modify the spread. The number NN' of laws is chosen arbitrarily as equal to 2 for this example, i.e. n={0,1}. The number $N_n$ is variable for a periodic pattern consisting of three blocks of $K_0$ symbols for the law $I_0(k)$ ($N_0$=3) and two blocks of $K_1$ data symbols for the law $I_1(k)$ ($N_1$=2). The interleaving laws considered are $K_0$=576 and $K_1$=432 multiples of 24 and 12 corresponding to the size Lc of the sequence spreading codes. Assuming that the spreading sequences are the result of fast unitary transformations, Lc different sequences can be used for simultaneous transmission of data symbols allocated to Lc different users. For these two interleaving sizes, where the symbols assigned to Lc users are interleaved by the law $I_n(k)$, Nc symbols for each user are integrated into the interleaving process as follows:

$$N_c = \frac{K_n}{L_c = N_u} \quad (6)$$

The parameters $p_n$, $j_n$ chosen to define the laws $I_0(k)$ and $I_1(k)$ are those that provide the maximum spread $\Delta_{eff} I_{p_n,q_n}^{(j_n)}(s)$ (n={0,1}) between adjacent data symbols and between symbols separated by a value of s less than the size of the spreading code Lc ($1 \leq s \leq L_c$) to optimize the spread between symbols allocated to different users and transmitted simultaneously. The parameter $q_n$ is chosen arbitrarily as equal to 2. For a sequence size of Lc=12 or Lc=24, the process selects four values for s, s={1, 2, 6, 12}, less than the spreading length of the codes, i.e. less than the potential number of codes that can be assigned to different users.

Interleaving is effected on the blocks of symbols of size $K_0$=432 and $K_1$=576. These sizes are multiples of the spreading lengths of the sequences and, if the number Nu of users is equal to the length of the spreading sequence, allow to allocate the same number of data symbols to each user for each interleaved data block. In the embodiment considered, two adjacent data symbols are considered as assigned to different users. For these two interleaving sizes, the spreads $\Delta_{eff} I_{p,q}^{(j)}(s)$ calculated using the equations (3) are given in Appendix 2. For each block size, the method selects the values of $p_n$, $q_n$, and $j_n$ with maximum spread for all values of s considered and values of $P_n$, $q_n$, and $j_n$ such that the spread for s=1 has no common sub-multiple with the size of the block $K_n$ concerned. The values selected for each interleaving size are given in Appendix 2.

If optimized multi-user multiplexing of the data symbols is effected upstream of interleaving according to the invention, then it is preferable to make p a multiple of the number Nu of users.

A method of the invention can be implemented by various means. For example, the method can be implemented in hardware, in software or in a combination of the two.

For a hardware implementation, the time interleaver ETS or some components of the time interleaver ETS (for example the interleaving device ET) used to execute the various steps in the transmitter can be integrated into one or more application-specific integrated circuits (ASICs), digital signal processors (DSPs, DSPDs), programmable logic circuits (PLDs, FPGAs), controllers, microcontrollers, microprocessors or any other electronic component designed to execute the functions described above.

For a software implementation, some or all of the steps of an interleaving method of the invention can be implemented by modules that execute the functions described above. The software code can be stored in a memory and executed by a processor. The memory can be part of the processor or external to the processor and coupled to it by means known to the person skilled in the art.

Consequently, the invention consists further in a computer program, in particular a computer program on or in an information medium or memory, adapted to implement the invention. This program can use any programming language and take the form of source code, object code or a code intermediate between source code and object code, such as a partially-compiled form, or any other form desirable for implementing a method of the invention.

The information medium can be any entity or device capable of storing the program. For example the medium can include storage means, such as a ROM, for example a CD ROM or a microelectronic circuit ROM, or magnetic storage means, for example a floppy disk or a hard disk.

Moreover, the information medium can be a transmissible medium such as an electrical or optical signal, which can be routed via an electrical or optical cable, by radio or by other means. The program of the invention can in particular be downloaded over an Internet-type network.

APPENDIX 1

TABLE I

| Piconet Channel | Chip Rate | Center Frequency | Spreading Code Set |
|---|---|---|---|
| 1  | 1313 MHz | 3939 MHz | 1 |
| 2  | 1326 MHz | 3978 MHz | 2 |
| 3  | 1339 MHz | 4017 MHz | 3 |
| 4  | 1352 MHz | 4056 MHz | 4 |
| 5  | 1300 MHz | 3900 MHz | 5 |
| 6  | 1365 MHz | 4094 MHz | 6 |
| 7  | 2626 MHz | 7878 MHz | 1 |
| 8  | 2652 MHz | 7956 MHz | 2 |
| 9  | 2678 MHz | 8034 MHz | 3 |
| 10 | 2704 MHz | 8112 MHz | 4 |
| 11 | 2600 MHz | 7800 MHz | 5 |
| 12 | 2730 MHz | 8190 MHz | 6 |

APPENDIX 2

Selection of interleaving matrices of size $K_0=432$, law $I_0(k)$

TABLE II

Possible values of the parameters $\{p, q, j\}$ for the interleaving matrices of size $K_0 = 432$ $s = \{1, 2\}$

| | $K_0 = 432$ | | | | | |
|---|---|---|---|---|---|---|
| | j = 1 | | j = 2 | | j = 3 | |
| | s | | | | | |
| p | 1 | 2 | 1 | 2 | 1 | 2 |
| 2  | 11  | 22  | 85  | 170 | 181 | 70  |
| 3  | 23  | 46  | 23  | 46  | 23  | 46  |
| 4  | 39  | 78  | 55  | 110 | 25  | 50  |
| 6  | 83  | 166 | 83  | 166 | 83  | 166 |
| 8  | 143 | 146 | 145 | 142 | 1   | 2   |
| 9  | 179 | 74  | 37  | 74  | 37  | 74  |
| 12 | 121 | 190 | 121 | 190 | 121 | 190 |
| 16 | 111 | 210 | 209 | 14  | 97  | 194 |
| 18 | 181 | 70  | 181 | 70  | 181 | 70  |
| 24 | 97  | 194 | 97  | 194 | 97  | 194 |
| 32 | 49  | 98  | 191 | 50  | 145 | 142 |
| 36 | 71  | 142 | 71  | 142 | 71  | 142 |
| 48 | 49  | 98  | 49  | 98  | 49  | 98  |

Possible values of the parameters $\{p, q, j\}$ for the interleaving matrices of size $K_0 = 432$ $s = \{6, 12\}$

| | $K_0 = 432$ | | | | | |
|---|---|---|---|---|---|---|
| | j = 1 | | j = 2 | | j = 3 | |
| | s | | | | | |
| p | 6 | 12 | 6 | 12 | 6 | 12 |
| 2  | 66  | 132 | 78  | 156 | 210 | 12  |
| 3  | 138 | 156 | 138 | 156 | 138 | 156 |
| 4  | 198 | 36  | 102 | 204 | 150 | 132 |
| 6  | 66  | 132 | 66  | 132 | 66  | 132 |
| 8  | 6   | 12  | 6   | 12  | 6   | 12  |
| 9  | 210 | 12  | 210 | 12  | 210 | 12  |
| 12 | 138 | 156 | 138 | 156 | 138 | 156 |
| 16 | 198 | 36  | 42  | 84  | 150 | 132 |
| 18 | 210 | 12  | 210 | 12  | 210 | 12  |
| 24 | 150 | 132 | 150 | 132 | 150 | 132 |
| 32 | 138 | 156 | 150 | 132 | 6   | 12  |
| 36 | 6   | 12  | 6   | 12  | 6   | 12  |
| 48 | 138 | 156 | 138 | 156 | 138 | 156 |

Interleaving parameters selected according to the criterion of maximization of the spread for $s=\{1, 2, 6, 12\}$. These values generate four different matrices of size $K_0$ for the law $I_0(k)$, of which only one is used in the example given.

| $K_0$ | $p_0$ | $q_0$ | $j_0$ |
|---|---|---|---|
| 432 | 12 | 2 | $j = \{1, 2, 3\}$ |
| 432 | 24 | 2 | 3 |

Selection of the interleaving parameters of the interleaving matrices of size $K_1=576$, law $I_1(k)$

TABLE III

Possible values of the parameters $\{p, q, j\}$ for the interleaving matrices of size $K_1 = 576$ $s = \{1, 2\}$

| | $K_1 = 576$ | | | | | |
|---|---|---|---|---|---|---|
| | j = 1 | | j = 2 | | j = 3 | |
| | s | | | | | |
| p | 1 | 2 | 1 | 2 | 1 | 2 |
| 2  | 11  | 22  | 85  | 170 | 107 | 214 |
| 3  | 23  | 46  | 167 | 242 | 121 | 242 |
| 4  | 39  | 78  | 89  | 178 | 25  | 50  |
| 6  | 83  | 166 | 205 | 166 | 205 | 166 |
| 8  | 143 | 286 | 143 | 286 | 143 | 286 |
| 12 | 265 | 46  | 265 | 46  | 265 | 46  |
| 16 | 33  | 66  | 223 | 130 | 97  | 194 |
| 24 | 47  | 94  | 47  | 94  | 47  | 94  |
| 36 | 217 | 142 | 217 | 142 | 217 | 142 |
| 72 | 143 | 286 | 143 | 286 | 143 | 286 |

Possible values of the parameters $\{p, q, j\}$ for the interleaving matrices of size $K_1 = 576$ $s = \{6, 12\}$

| | $K_1 = 576$ | | | | | |
|---|---|---|---|---|---|---|
| | j = 1 | | j = 2 | | j = 3 | |
| | s | | | | | |
| p | 6 | 12 | 6 | 12 | 6 | 12 |
| 2  | 66  | 132 | 66  | 132 | 66  | 132 |
| 3  | 138 | 276 | 150 | 276 | 150 | 276 |
| 4  | 234 | 108 | 42  | 84  | 150 | 276 |
| 6  | 78  | 156 | 78  | 156 | 78  | 156 |
| 8  | 282 | 12  | 282 | 12  | 282 | 12  |
| 12 | 138 | 276 | 138 | 276 | 138 | 276 |
| 16 | 198 | 180 | 186 | 204 | 6   | 12  |
| 24 | 282 | 12  | 282 | 12  | 282 | 12  |
| 36 | 150 | 276 | 150 | 276 | 150 | 276 |
| 72 | 282 | 12  | 282 | 12  | 282 | 12  |

Interleaving parameters selected for the law $I_1(k)$ of size $K_1$ according to the criterion of maximization of the spread for $s=\{1, 2, 6, 12\}$.

| $p_1$ | $q_1$ | $j_1$ |
|---|---|---|
| 36 | 2 | j = {1, 2, 3} |

The invention claimed is:

1. A method for time interleaving data for sequential transmission by a baseband carrier of a single-carrier transmitter said method comprising the steps of interleaving, by a time interleaver, a block of data according to a particular interleaving law, wherein the block interleaving law is variable in time for a given transmission mode of the single-carrier transmitter and is obtained form an iterative interleaving algorithm generating an interleaving law variable as a function of the iteration, wherein the time interleaver sequentially transmits data by a baseband carrier of a single-carrier transmitter by interleaving a block of K data according to an interleaving law, said time interleaver comprising a calculation device for calculating the interleaving law that varies in time for a given transmission mode of the single-carrier transmitter wherein the calculation device includes a block size K interleaving device of size K with J iterations of index j, J being an integer greater than or equal to 1, K being an integer greater than or equal to 1, for interleaving input data indexed by a variable k={0, ..., K−1}, including J basic cells I with two inputs and one output, such that each basic cell I is formed of two elementary cells $L_{0,p}$ and $L_{1,p,q}$ that each have two inputs and one output and that use respective algebraic functions each one including modulo K with two inputs and one output, with parameters p and q, $L_{0,p}$ (k, k1) and $L_{1,p,q}$ (k, k2), the first inputs of the elementary cells and of the basic cells I being common and corresponding to the index k, the output of the basic cell I corresponding to the output of the elementary cell $L_{1,p,q}$, the two inputs of the basic cell I corresponding to the two inputs of the elementary cell $L_{0,p}$, the output of the elementary cell $L_{0,p}$ corresponding to the other input of the elementary cell $L_{1,p,q}$; and the two inputs of the first basic cell I are connected to each other; and the output of each basic cell I is connected to the second input of the basic cell I of the next iteration; and the output of the jth cell determines the interleaving law I(k).

2. A time interleaving method according to claim 1 wherein the interleaving law variable in time is obtained by selecting a law from a plurality of interleaving laws generated by means of an iterative interleaving algorithm generating an interleaving law variable as a function of the iteration.

3. A time interleaving method according to claim 1 wherein the time variation of the interleaving law is operative as a function of the value of a data block time index.

4. A time interleaving method according to claim 3 wherein the law variation is operative every N blocks of K data items, where N is at least 1 and is determined as a function of the properties of the transmission channel and the framing of the data.

5. A time interleaving method according to claim 4 wherein N varies in time.

6. A time interleaving method according to claim 4 wherein K varies in time.

7. A non-transitory information medium containing program instructions adapted to execute a data time interleaving method according to claim 1 when said program is loaded into and executed in an electronic device.

8. A time interleaver for sequentially transmitted data by a baseband carrier of a single-carrier transmitter, by interleaving a block of K data according to an interleaving law, said time interleaver comprising a calculation device for calculating the interleaving law that varies in time for a given transmission mode of the single-carrier transmitter wherein the calculation device includes a block size K interleaving device with J iterations of index j, J being an integer greater than or equal to 1, K being an integer greater than or equal to 1, for interleaving input data indexed by a variable k={0, ..., K−1}, including J basic cells I with two inputs and one output, such that each basic cell I is formed of two elementary cells $L_{0,p}$ and $L_{1,p,q}$ that each have two inputs and one output and that use respective algebraic functions each one including modulo K with two inputs and one output, with parameters p and q, $L_{0,p}$(k,k1) and $L_{1,p,q}$(k,k2), the first inputs of the elementary cells and of the basic cells I being common and corresponding to the index k, the output of the basic cell I corresponding to the output of the elementary cell $L_{1,p,q}$, the two inputs of the basic cell I corresponding to the two inputs of the elementary cell $L_{0,p}$, the output of the elementary cell $L_{0,p}$ corresponding to the other input of the elementary cell $L_{1,p,q}$; and the two inputs of the first basic cell I are connected to each other; and the output of each basic cell I is connected to the second input of the basic cell I of the next iteration; and the output of the $j^{th}$ cell determines the interleaving law I(k).

9. A time interleaver according to claim 8 wherein the two algebraic functions have the respective expressions $L_{0,p}$(k, k1)=$[-k-k_1 \cdot p]_K$ and $L_{1,p,q}$(k,k2)=$[K-p+k+q \cdot p \cdot k_2]_K$.

10. A method of time interleaving data with position index k to interleave a block of K data according to a particular interleaving law I(k), including a block size K interleaving device, with parameters p and q determined for a given spread, consisting of J iterations of index j of a turbo basic structure with two inputs and one output using in cascade a first algebraic function including modulo K with two inputs $L_{o,p}$(k,k1) of which one input is equal to the position index k of the data before interleaving and a second input $k_1$ is fed with the output of the preceding iteration, and a second algebraic function including modulo K with two inputs $L_{1,p,q}$(k, $k_2$) of which the second input $k_2$ is connected to the output of the first algebraic function, the output of the iteration J determining the interleaving function I(k) for the iteration J as being the combination of the two algebraic functions with $k_1$=k when j=1, J being an interger greater than or equal to 1, K being an interger greater than or equal to 1, in order to vary in time the time interleaving of data as a function of the choice in time of the values of J, p, q or K.

* * * * *